(12) United States Patent
Ichikawa et al.

(10) Patent No.: US 11,352,527 B2
(45) Date of Patent: Jun. 7, 2022

(54) SINTER-BONDING COMPOSITION, SINTER-BONDING SHEET AND DICING TAPE WITH SINTER-BONDING SHEET

(71) Applicant: NITTO DENKO CORPORATION, Ibaraki (JP)

(72) Inventors: Tomoaki Ichikawa, Ibaraki (JP); Yuki Sugo, Ibaraki (JP); Mayu Shimoda, Ibaraki (JP); Ryota Mita, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 0 days.

(21) Appl. No.: 16/763,298

(22) PCT Filed: Aug. 31, 2018

(86) PCT No.: PCT/JP2018/032290
§ 371 (c)(1),
(2) Date: May 12, 2020

(87) PCT Pub. No.: WO2019/092960
PCT Pub. Date: May 16, 2019

(65) Prior Publication Data
US 2020/0308456 A1 Oct. 1, 2020

(30) Foreign Application Priority Data
Nov. 13, 2017 (JP) .............................. JP2017-218355

(51) Int. Cl.
*C09J 9/02* (2006.01)
*C09J 11/04* (2006.01)
*C09J 7/35* (2018.01)

(52) U.S. Cl.
CPC ................. *C09J 9/02* (2013.01); *C09J 11/04* (2013.01); *C09J 7/35* (2018.01); *C09J 2203/326* (2013.01)

(58) Field of Classification Search
CPC ..... H01L 2224/48091; H01L 2924/181; H01L 2924/00012; H01L 2924/00014;
(Continued)

(56) References Cited

U.S. PATENT DOCUMENTS 8,501,299 B2 8/2013 Ikeda et al.
2004/0245648 A1 12/2004 Nagasawa et al.
(Continued)

FOREIGN PATENT DOCUMENTS

CN 101371624 A 2/2009
JP 2011-094223 A 5/2011
(Continued)

OTHER PUBLICATIONS

International Search Report for PCT/JP2018/032290 dated Oct. 23, 2018 [PCT/ISA/210].
(Continued)

*Primary Examiner* — Mark Kopec
*Assistant Examiner* — Jaison P Thomas
(74) *Attorney, Agent, or Firm* — Sughrue Mion, PLLC

(57) ABSTRACT

The sinter-bonding composition contains sinterable particles containing an electroconductive metal. The average particle diameter of the sinterable particles is 2 μm or less and the proportion of the particles having a particle diameter of 100 nm or less in the sinterable particles is not less than 80% by mass. The sinter-bonding sheet (10) has an adhesive layer made from such a sinter-bonding composition. The dicing tape with a sinter-bonding sheet (X) has such a sinter-bonding sheet (10) and a dicing tape (20). The dicing tape (20) has a lamination structure containing a base material (21) and an adhesive layer (22), and the sinter-bonding sheet (10) is positioned on the adhesive layer (22) of the dicing tape (20).

8 Claims, 5 Drawing Sheets

(58) Field of Classification Search
CPC .............. H01L 21/52; H01L 2224/27; H01L 2224/73265; H01L 2224/83191; H01L 2224/8384; H01L 2224/92247; H01L 2224/05166; H01L 2224/05639; H01L 2224/29386; H01L 2224/2939; H01L 2924/0541; H01L 2224/0345; H01L 2224/05073; H01L 2224/271; H01L 2224/27436; H01L 2224/29339; H01L 2224/29347; H01L 2224/29439; H01L 2224/29444; H01L 2224/75745; H01L 2224/83065; H01L 2224/83439; H01L 2224/83444; H01L 2224/83447; H01L 2224/83455; H01L 2224/83464; H01L 2224/83469; H01L 2224/85207; H01L 2224/94; H01L 2224/95; H01L 2224/97; H01L 2224/83; H01L 2924/01029; H01L 2924/01047; H01L 2924/0635; H01L 2924/068; H01L 21/561; H01L 21/6836; H01L 2221/68327; H01L 2221/68377; H01L 2224/04026; H01L 2224/27003; H01L 2224/29499; H01L 2224/32227; H01L 2224/32245; H01L 2224/48227; H01L 2224/48245; H01L 2224/83055; H01L 2224/83075; H01L 2224/83204; H01L 2224/83907; H01L 24/03; H01L 24/05; H01L 24/27; H01L 24/29; H01L 24/32; H01L 24/48; H01L 24/75; H01L 24/83; H01L 24/85; H01L 2924/10272; H01L 2924/1033; B22F 1/00; B22F 1/052; B22F 1/054; B22F 1/102; B22F 2007/047; B22F 7/008; B22F 7/04; B22F 9/24; C09J 11/04; C09J 201/00; C09J 2203/326; C09J 7/35; C09J 7/38; C09J 9/02; C09J 2301/408; C09J 2433/00; C09J 2469/00; C09J 7/10; B23K 35/0244; B23K 35/3006; B23K 35/3613; C08K 2003/0806; C08K 2003/085; C08K 2003/2248; C08K 2003/2286

See application file for complete search history.

(56) References Cited

U.S. PATENT DOCUMENTS

| | | | |
|---|---|---|---|
| 2009/0011201 A1* | 1/2009 | Ikeda .................. | H05K 3/4061 428/206 |
| 2012/0103515 A1 | 5/2012 | Endoh et al. | |
| 2012/0107628 A1 | 5/2012 | Komatsu et al. | |
| 2013/0105980 A1 | 5/2013 | Yasuda et al. | |
| 2015/0353804 A1* | 12/2015 | Ghosal .................. | C09C 1/62 419/8 |
| 2017/0306170 A1 | 10/2017 | Leamon et al. | |
| 2017/0369744 A1* | 12/2017 | Sugo .................. | C09J 9/02 |
| 2018/0269175 A1* | 9/2018 | Sugo .................. | C09J 7/10 |
| 2018/0273808 A1 | 9/2018 | Kamakura et al. | |
| 2018/0277507 A1* | 9/2018 | Sugo .................. | C09J 7/24 |
| 2019/0043824 A1* | 2/2019 | Sugo .................. | H01L 24/27 |
| 2019/0118257 A1 | 4/2019 | Kurita et al. | |
| 2019/0206825 A1* | 7/2019 | Sugo .................. | H01L 24/29 |
| 2020/0048504 A1* | 2/2020 | Sugo .................. | H01L 21/6836 |

FOREIGN PATENT DOCUMENTS

| | | | | |
|---|---|---|---|---|
| JP | 2013-039580 A | 2/2013 | | |
| JP | 2013-091835 A | 5/2013 | | |
| JP | 2016-121329 A | 7/2016 | | |
| TW | 201533206 A | 9/2015 | | |
| WO | 2005/079353 A2 | 9/2005 | | |
| WO | 2008/065728 A1 | 6/2008 | | |
| WO | WO-2016104188 A1 * | 6/2016 | ............... | C09J 5/06 |
| WO | 2017/057485 A1 | 4/2017 | | |
| WO | 2017/188206 A1 | 11/2017 | | |

OTHER PUBLICATIONS

Extended European Search Report dated Jul. 22, 2021, issued by the European Patent Office in application No. 18876142.3.
Communication dated Jan. 11, 2022 from the Chinese Patent Office in Chinese Application No. 201880073024.6.
Office Action dated Mar. 21, 2022 from the Taiwanese Patent Office in Taiwanese Application No. 107138758.

* cited by examiner

SINTER-BONDING COMPOSITION, SINTER-BONDING SHEET AND DICING TAPE WITH SINTER-BONDING SHEET

CROSS REFERENCE TO RELATED APPLICATIONS

This application is a National Stage of International Application No. PCT/JP2018/032290 filed Aug. 31, 2018, claiming priority based on Japanese Patent Application No. 2017-218355 filed Nov. 13, 2017.

TECHNICAL FIELD

The present invention relates to a sinter-bonding composition, a sinter-bonding sheet, and a dicing tape with a sinter-bonding sheet, capable of being used in manufacturing semiconductor devices or the like.

BACKGROUND ART

In manufacture of semiconductor devices, as techniques for die bonding a semiconductor chip to a support substrate such as a lead frame or an insulating circuit board while making electric connection with the support substrate side, a technique for forming a Au—Si eutectic alloy layer between the support substrate and the chip to materialize a bonding state, and a technique for utilizing a solder or an electroconductive particle-containing resin as a bonding material are known.

In recent years, the spread of power semiconductor devices responsible for the power supply control has been remarkable, and in many cases the power semiconductor devices are large in the amount of heat generated due to being large in the amount of current carried during operation. Hence, in manufacture of power semiconductor devices, for the techniques for die bonding a semiconductor chip to a support substrate while making electric connection with the support substrate side and, it is demanded that a highly reliable bonding state also during high-temperature operation is enabled to be materialized. In particular, in power semiconductor devices adopting SiC or GaN as their semiconductor materials to realize high-temperature operation, such a demand is strong. Then, in order to meet such a demand, a technology for using a sinter-bonding composition containing sinterable particles, a solvent and the like as the die bonding technique involving electric connection is proposed.

In the die bonding carried out by using the sinter-bonding composition containing sinterable particles, first, a semiconductor chip is mounted on a predetermined chip bonding position of a support substrate through the sinter-bonding composition under conditions of a predetermined temperature and loading. Thereafter, the resultant is subjected to a heating step under conditions of a predetermined temperature and pressure so that the volatilization of the solvent and the like in the sinter-bonding composition occur between the support substrate and the semiconductor chip thereon and sintering progresses among the sinterable particles. Thereby, a sintered layer is formed between the support substrate and the semiconductor chip, and the semiconductor chip results in being electrically connected with and mechanically bonded to the support substrate. Such a technology is described, for example, in the following Patent Literatures 1 and 2.

CITATION LIST

Patent Literature

[Patent Literature 1] International Publication No. WO2008/065728
[Patent Literature 2] Japanese Patent Laid-Open No. 2013-039580

SUMMARY OF INVENTION

Technical Problem

In die bonding carried out by using a sinter-bonding composition containing sinterable particles, there are conventionally cases where in a sintered layer formed between a support substrate and a semiconductor chip, sufficient bonding reliability cannot be secured due to the porosity thereof being high. The higher the loading conditions including the pressurizing condition in a high-temperature heating step for sintering, the lower the porosity of a sintered layer to be formed is likely to become, but the higher the performance required for an apparatus or a facility for carrying out the sintering process. From the viewpoint of the production efficiency of an object to be manufactured, the performance required for the apparatus or the facility for the sintering process is preferably not high.

The present invention has been devised under the above situation and has an object to provide a sinter-bonding composition, a sinter-bonding sheet and a dicing tape with a sinter-bonding sheet, which are suitable for materializing sinter-bonding by a high-density sintered layer under a low-loading condition.

Solution to Problem

According to a first aspect of the present invention, a sinter-bonding composition is provided. The sinter-bonding composition comprises sinterable particles containing an electroconductive metal. The average particle diameter of the sinterable particles in the present composition is 2 μm or less. Simultaneously, the proportion of particles having a particle diameter of 100 nm or less in the sinterable particles is not less than 80% by mass. That is, the proportion of particles having a particle diameter of more than 100 nm in the sinterable particles is not more than 20% by mass. The present composition having such a constitution can be used for sinter-bonding objects to be bonded. The present composition can be used, for example, in manufacture of semiconductor devices, for sinter-bonding a semiconductor chip to a support substrate while making electric connection with the support substrate side.

In the process of materializing sinter-bonding by using the sinter-bonding composition, for example, objects to be bonded are pressure-bonded and temporarily fixed under a predetermined condition in a state where the composition intervenes between the objects to be bonded, and then subjected to a high-temperature heating step under predetermined temperature and pressurization conditions, whereby a sintered layer to bond the objects to be bonded is formed from the composition. The present inventors have acquired the finding that the above constitution of the particle size distribution of the sinterable particles containing an electroconductive metal blended in the sinter-bonding composition to be used in such a sinter-bonding process, that is, a constitution where the proportion of particles thereof having an average particle diameter of 2 μm or less and a particle diameter of 100 nm or less is 80% by mass or more, is suitable for forming a high-density sintered layer from the composition by sintering under a low-loading condition. This finding is, for example, as shown in Examples and Comparative Examples described later. According to the above constitution of the particle size distribution of the sinterable particles having an average particle diameter of 2 μm or less, when the content proportion of the sinterable particles in the present sinter-bonding composition is, for example, as high as 85% by mass or more, it is conceivable that a group of particles thereof having a particle diameter of 100 nm or less and a group of particles thereof having a particle diameter of more than 100 nm in the composition assume a close packing state and the gross contact area among particles becomes easily large. The larger the gross contact area among particles, the lower the loading conditions including the pressurizing condition for suitably integrating the sinterable particles by sintering are likely to become.

Further the present inventors have also acquired the finding that the higher the density of the sintered layer formed from the composition containing the sinterable particles containing an electroconductive metal, the higher bonding reliability is likely to be attained in the sintered layer. This finding is, for example, as shown in Examples and Comparative Examples described later. In particular, in sinter-bonding for mechanically bonding a semiconductor chip to a support substrate while making electric connection with the support substrate side, it is demanded that high reliability is secured in bonding of objects to be bonded by the sintered layer. The present composition suitable for materializing sinter-bonding by the high-density sintered layer under a low-loading condition is suitable for materializing a high bonding reliability by the high-density sintered layer through a sintering process under the low-loading condition.

As described above, the sinter-bonding composition according to the first aspect of the present invention is suitable for materializing sinter-bonding by the high-density sintered layer under the low-loading condition, and therefore is suitable for materializing a high bonding reliability by the high-density sintered layer through a sintering process under the low-loading condition. Such a sinter-bonding composition is preferable from the viewpoint of the improvement of the production efficiency of an object to be manufactured. In the present invention, the low-loading condition under the sintering process includes a no-pressurizing condition.

The content proportion of the sinterable particles in the present sinter-bonding composition is preferably 90 to 98% by mass, more preferably 92 to 98% by mass and more preferably 94 to 98% by mass. Such a constitution is suitable for attaining the density enhancement of the sintered layer to be formed.

The porosity of the present sinter-bonding composition is preferably 10% or less, more preferably 8% or less, more preferably 6% or less and more preferably 4% or less. Such a constitution is suitable for attaining the density enhancement of the sintered layer to be formed.

The present sinter-bonding composition preferably comprises, together with the above-mentioned sinterable particle containing an electroconductive metal, a thermally decomposable polymeric binder. In the present invention, the thermally decomposable polymeric binder refers to a binder component capable of being thermally decomposed by a high-temperature heating process for sinter-bonding. According to such a constitution, at the temperature of the above temporary fixation, for example, at 70° C. or in a temperature range near this, the cohesive strength of the present sinter-bonding composition is easily secured by utilizing viscoelasticity of the thermally decomposable polymeric binder and therefore, the adhesive strength of the composition is easily secured. Hence, the present constitution is suitable for suppressing the occurrence of a positional shift of objects to be bonded when the objects to be bonded are pressure-bonded in a state where the present sinter-bonding composition intervenes between the objects to be bonded or after the pressure-bonding.

The weight-average molecular weight of the thermally decomposable polymeric binder in the present sinter-bonding composition is preferably 10,000 or more. Such a constitution is suitable for securing the cohesive strength and the adhesive strength of the present sinter-bonding composition by utilizing the viscoelasticity of the thermally decomposable polymeric binder.

The thermally decomposable polymeric binder in the present sinter-bonding composition is preferably a polycarbonate resin and/or an acrylic resin. As described above, in the process of materializing sinter-bonding by using the sinter-bonding composition, objects to be bonded are temporarily fixed with the composition, and then subjected to a high-temperature heating for sinter-bonding. Since the high-temperature heating for sinter-bonding is carried out, for example, at 300° C. or in a temperature range near this, it is easy for the polycarbonate resin and the acrylic resin to be provided as polymeric binders to be decomposed and vaporized at a temperature of about 300° C. Therefore, the present constitution is suitable for reducing organic residues in the sintered layer formed between objects to be bonded sinter-bonded by using the present sinter-bonding composition. The less the organic residues in the sintered layer, the firmer the sintered layer is likely to be; therefore, high bonding reliability is easily attained in the sintered layer.

The sinterable particles in the present sinter-bonding composition preferably contain at least one selected from the group consisting of silver, copper, silver oxide and copper oxide. Such a constitution is suitable for forming a firm sintered layer between objects to be bonded sinter-bonded by using the present sinter-bonding composition.

According to a second aspect of the present invention, a sinter-bonding sheet is provided. The sinter-bonding sheet has an adhesive layer made from the above-mentioned sinter-bonding composition according to the first aspect of the present invention. Such a constitution is suitable for supplying the sinter-bonding composition in a uniform thickness between objects to be bonded and sinter-bonding the objects to be bonded by a sintered layer having a uniform thickness. The sinter-bonding by the sintered layer having a uniform thickness is suitable for materializing a high reliability of bonding of, for example, a semiconductor chip to a support substrate. Additionally, the present sinter-bonding composition is suitable for suppressing protruding of the sintering metal from between objects to be bonded and creeping-up of the sintering metal on side faces of the objects to be bonded and simultaneously sinter-bonding the objects to be bonded. The present sinter-bonding composition, since the sinter-bonding material is supplied in the form of a sheet which is unlikely to fluidize, is suitable for suppressing such protruding and creeping-up. The suppression of such protruding and creeping-up is suitable for improving the yield of objects to be manufactured such as semiconductor devices whose manufacture involves sinter-bonding.

According to a third aspect of the present invention, a dicing tape with a sinter-bonding sheet is provided. The dicing tape with a sinter-bonding sheet has a dicing tape and the above-mentioned sinter-bonding sheet according to the second aspect of the present invention. The dicing tape has a lamination structure containing a base material and an adhesive layer, and the sinter-bonding sheet is disposed on the adhesive layer of the dicing tape. The dicing tape having such a constitution can be used for obtaining a semiconductor chip having a chip-size sinter-bonding sheet in a manufacture process of semiconductor devices. Then, according to the present dicing tape, in sinter-bonding in a manufacture process of semiconductor devices, the same effect as described above with regard to the sinter-bonding composition according to the first aspect of the present invention can be obtained, and the same effect as described above with regard to the sinter-bonding sheet according to the second aspect of the present invention can be obtained.

DESCRIPTION OF EMBODIMENTS

Figure 1:
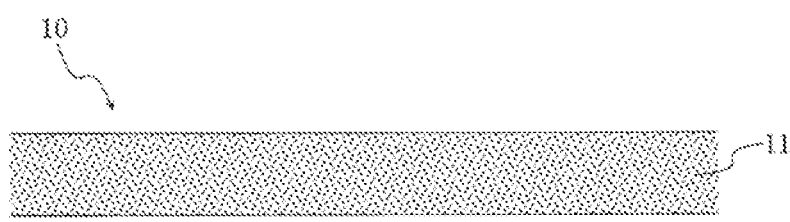
FIG. 1 is a partial cross-sectional schematic view of a sinter-bonding sheet according to one embodiment of the present invention.

FIG. 1 is a partial cross-sectional schematic view of a sinter-bonding sheet 10 according to one embodiment of the present invention. The sinter-bonding sheet 10 is one for use in sinter-bonding objects to be bonded, and has an adhesive layer 11 made from the sinter-bonding composition according to the present invention. In the present embodiment, the adhesive layer 11 or the sinter-bonding composition making this, includes at least, sinterable particles containing an electroconductive metal, a thermally decomposable polymeric binder and a low-boiling point binder. Such a sinter-bonding sheet 10 can be used for sinter-bonding a semiconductor chip to a support substrate while making electrical connection with the support substrate side, for example, in a manufacture process of semiconductor devices.

The sinterable particles contained in the sinter-bonding sheet 10 or its adhesive layer 11 are sinterable particles containing an electroconductive metal element. Examples of the electroconductive metal element include gold, silver, copper, palladium, tin and nickel. Examples of constituting materials of such sinterable particles include gold, silver, copper, palladium, tin, nickel and metal alloys of two or more selected from the group consisting thereof. Examples of the constituting materials of the sinterable particles also include metal oxides such as silver oxide, copper oxide, palladium oxide and tin oxide. Then the sinterable particles may be particles having a core-shell structure. The sinterable particles may be particles having a core-shell structure, for example, which has a core of copper as a main component and a shell, of gold, silver or the like as a main component, coating the core. In the present embodiment, the sinterable particles preferably contain at least one selected from the group consisting of silver particles, copper particles, silver oxide particles and copper oxide particles. From the viewpoint of materializing high electroconductivity and high thermoconductivity in the sintered layer to be formed, the sinterable particles are preferably silver particles and copper particles. Additionally from the viewpoint of oxidation resistance, the silver particles are preferable because of their ease of handling. For example, in sinter-bonding of a semiconductor chip to a copper substrate with a silver plating, in the case of using a sintering material containing copper particles as sinterable particles, the sintering process needs to be carried out in an inert atmosphere such as a nitrogen atmosphere; however, in the case of using a sintering material containing silver particles as sinterable particles, the sintering process can suitably be carried out even in the air atmosphere.

The average particle diameter of the sinterable particles contained in the sinter-bonding sheet 10 or its adhesive layer 11 is 2 μm or less. From the viewpoint of securing good sinterability by materializing a low sintering temperature for the sinterable particles or the like, the average particle diameter of the sinterable particles is preferably 1.5 μm or less, more preferably 1.2 μm or less, more preferably 1 μm or less, more preferably 700 nm or less, and more preferably 500 nm or less. From the viewpoint of securing good dispersibility for the sinterable particles in the adhesive layer 11 or the composition for forming the same, the average particle diameter of the sinterable particles is preferably 70 nm or more and more preferably 100 nm or more.

The average particle diameter of the sinterable particles can be determined based on observation carried out by using a scanning electron microscope (SEM). The average particle diameter of the sinterable particles when the adhesive layer contains the sinterable particles can specifically be determined by the following method. First, ion polishing is carried out on the adhesive layer containing the sinterable particles in a cooled environment to thereby expose a cross-section of the adhesive layer. Then, the exposed cross-section is imaged by using a field emission scanning electron microscope, SU8020 (manufactured by Hitachi High-Technologies Corp.), to thereby acquire a reflection electron image as image data. The imaging conditions are an acceleration voltage of 5 kV and a magnification of 50,000. Then, the acquired image data is subjected to an automatic binarization process using image analyzing software, Image J, and thereafter, the average particle diameter of particles was calculated from the image data.

The content proportion of the sinterable particles in the adhesive layer 11 is, for example, 85% by mass or more, preferably 90 to 98% by mass or more, more preferably 92 to 98% by mass or more and more preferably 94 to 98% by mass or more.

The proportion of particles having a particle diameter of 100 nm or less in the sinterable particles in the adhesive layer 11 is 80% by mass or more, preferably 85% by mass or more and more preferably 90% by mass or more. That is, the proportion of particles having a particle diameter of more than 100 nm in the sinterable particles in the adhesive layer 11 is 20% by mass or less, preferably 15% by mass or less and more preferably 10% by mass or less.

The thermally decomposable polymeric binder contained in the sinter-bonding sheet 10 or its adhesive layer 11 is a binder component thermally decomposable in a high-temperature heating process for sinter-bonding, and an element contributing to retention of the sheet shape of the sinter-bonding sheet 10 or its adhesive layer 11 until the process before the high-temperature heating process. In the present embodiment, from the viewpoint of securing the sheet shape-retaining function, the thermally decomposable polymeric binder is a material solid at normal temperature (23° C.). Examples of such a thermally decomposable polymeric binder include polycarbonate resins and acrylic resins.

Examples of the polycarbonate resins as the thermally decomposable polymeric binder include an aliphatic polycarbonate containing no aromatic compound such as a benzene ring and composed of aliphatic chains between carbonate groups (—O—CO—O—) of its main chain, and an aromatic polycarbonate containing aromatic compounds between carbonate groups (—O—CO—O—) of its main chain. Examples of the aliphatic polycarbonate include polyethylene carbonate and polypropylene carbonate. Examples of the aromatic polycarbonate include polycarbonate having a bisphenol A structure in its main chain.

Examples of the acrylic resin as the thermally decomposable polymeric binder include polymers of an acrylate and/or a methacrylate having a straight-chain or branched alkyl group having 4 to 18 carbon atoms. Hereinafter, "(meth)acryl" represents "acryl" and/or "methacryl". Examples of the alkyl group of the (meth)acrylate making the acrylic resin as the thermally decomposable polymeric binder include a methyl group, an ethyl group, a propyl group, an isopropyl group, a n-butyl group, a t-butyl group, an isobutyl group, an amyl group, an isoamyl group, a hexyl group, a heptyl group, a cyclohexyl group, a 2-ethylhexyl group, an octyl group, an isooctyl group, a nonyl group, an isononyl group, a decyl group, an isodecyl group, an undecyl group, a lauryl group, a tridecyl group, a tetradecyl group, a stearyl group and an octadecyl group.

The acrylic resins as the thermally decomposable polymeric binder may be polymers containing a monomer unit originated from another monomer other than the above (meth)acrylate. Examples of such another monomer include carboxy group-containing monomers, acid anhydride-containing monomers, hydroxy group-containing monomers, sulfonic acid group-containing monomers and phosphoric acid group-containing monomers. Specific examples of the carboxy group-containing monomers include acrylic acid, methacrylic acid, carboxyethylacrylate, carboxypentylacrylate, itaconic acid, maleic acid, fumaric acid and crotonic acid. Examples of the acid anhydride monomers include maleic anhydride and itaconic anhydride. Examples of the hydroxy group-containing monomers include 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate and 4-(hydroxymethyl)cyclohexylmethyl (meth)acrylate. Examples of the sulfonic acid group-containing monomers include styrenesulfonic acid, allylsulfonic acid, 2-(meth)acrylamido-2-methylpropanesulfonic acid, (meth)acrylamidopropanesulfonic acid, sulfopropyl (meth)acrylate and (meth)acryloyloxynaphthalenesulfonic acid. Examples of the phosphoric acid group-containing monomers include 2-hydroxyethylacryloyl phosphate.

The weight-average molecular weight of the thermally decomposable polymeric binder is preferably 10,000 or more. The weight-average molecular weight of the thermally decomposable polymeric binder is taken as a value measured by gel permeation chromatography (GPC) in terms of polystylene.

The content proportion of the thermally decomposable polymeric binder in the adhesive layer 11 is, from the viewpoint of making the above-mentioned sheet shape-retaining function to be suitably exhibited, preferably 0.5 to 10% by mass, more preferably 0.8 to 8% by mass and more preferably 1 to 6% by mass.

The low-boiling point binder contained in the sinter-bonding sheet 10 or its adhesive layer 11 is taken as a liquid or semi-liquid one having a viscosity of $1 \times 10^5$ Pa·s or less as measured at 23° C. by using a dynamic viscoelasticity measuring device (trade name: "HAAKE MARS III", Thermo Fisher Scientific Inc.). In the present viscosity measurement, jigs to be used are 20-mmϕ parallel plates; the gap between the plates is set at 100 μm; and the shearing rate in rotational shear is set at $1\ s^{-1}$.

Examples of the low-boiling point binder contained in the adhesive layer 11 include terpene alcohols, alcohols except terpene alcohols, alkylene glycol alkyl ethers and ethers except alkylene glycol alkyl ethers. Examples of the terpene alcohols include isobornylcyclohexanol, citronellol, geraniol, nerol, carveol, and α-terpineol. Examples of the alcohols except terpene alcohols include pentanol, hexanol, heptanol, octanol, 1-decanol, ethylene glycol, diethylene glycol, propylene glycol, butylene glycol and 2,4-diethyl-1,5-pentanediol. Examples of the alkylene glycol alkyl ethers include ethylene glycol butyl ether, diethylene glycol methyl ether, diethylene glycol ethyl ether, diethylene glycol butyl ether, diethylene glycol isobutyl ether, diethylene glycol hexyl ether, triethylene glycol methyl ether, diethylene glycol dimethyl ether, diethylene glycol diethyl ether, diethylene glycol dibutyl ether, diethylene glycol butyl methyl ether, diethylene glycol isopropyl methyl ether, triethylene glycol dimethyl ether, triethylene glycol butyl methyl ether, propylene glycol propyl ether, dipropylene glycol methyl ether, dipropylene glycol ethyl ether, dipropylene glycol propyl ether, dipropylene glycol butyl ether, dipropylene glycol dimethyl ether, tripropylene glycol methyl ether and tripropylene glycol dimethyl ether. Examples of the ethers except alkylene glycol alkyl ethers include ethylene glycol ethyl ether acetate, ethylene glycol butyl ether acetate, diethylene glycol ethyl ether acetate, diethylene glycol butyl ether acetate, dipropylene glycol methyl ether acetate and ethylene glycol phenyl ether. As the low-boiling point binder contained in the adhesive layer 11, one low-boiling point binder may be used or two or more low-boiling point binders may be used. As the low-boiling point binder contained in the adhesive layer 11, from the viewpoint of stability at normal temperature, terpene alcohols are preferable and isobornylcyclohexanol is more preferable.

The sinter-bonding sheet 10 or its adhesive layer 11 may contain, in addition to the above components, for example, a plasticizer and the like.

The thickness at 23° C. of the adhesive layer 11 is preferably 5 μm or more and more preferably 10 μm or more, and preferably 100 μm or less and more preferably 80 μm or less. Then, the viscosity at 70° C. of the adhesive layer 11 or the sinter-bonding composition making this is, for example, $5 \times 10^3$ to $1 \times 10^7$ Pa·s and preferably $1 \times 10^4$ to $1 \times 10^6$ Pa·s.

The porosity of the adhesive layer 11 or the sinter-bonding composition making this is preferably 10% or less, more preferably 8% or less, more preferably 6% or less and more preferably 4% or less. Then, the adhesive layer 11 or the sinter-bonding composition making this has a porosity, after being sintering involving a heating step at a pressure of 10 MPa at 300° C. for 2.5 min (that is, a porosity of the sintered layer to be formed from the adhesive layer 11 by the sintering), of preferably 10% or less, more preferably 8% or less, more preferably 6% or less and more preferably 4% or less.

The sinter-bonding sheet 10 can be fabricated, for example, by mixing the above-mentioned each component in a solvent to prepare a vanish, applying the vanish on a separator as a base material to form a coating film, and drying the coating film. As a solvent for preparing the vanish, an organic solvent or an alcohol solvent can be used. Examples of organic solvents include dimethylformamide, dimethylacetamide, N-methylpyrrolidone, acetone, methyl ethyl ketone, cyclohexanone, toluene and xylene. Examples of alcohol solvents include ethylene glycol, diethylene glycol, 1,2-propanediol, 1,3-propanediol, 1,2-butanediol, 1,3-butanediol, 1,4-butanediol, 2-butene-1,4-diol, 1,2,6-hexanetriol, glycerol, octanediol, 2-methyl-2,4-pentanediol and terpineol. As the base material or the separator, polyethylene terephthalate (PET) films, polyethylene films, polypropylene films, various plastic films and papers surface-coated with a release agent (for example, a fluorine-containing release agent or a long-chain alkyl acrylate-based release agent), and the like can be used. For application of the vanish on the base material, for example, a die coater, a gravure coater, a roll coater, a reverse coater, a comma coater or a pipe doctor coater can be used. Then the drying temperature of the coating film is, for example, 70 to 160° C. and the drying time of the coating film is, for example, 1 to 5 min.

FIG. 2(a) to FIG. 4(b) show part of steps in a semiconductor device-manufacturing method carried out by using the sinter-bonding sheet 10.

Figure 2A:
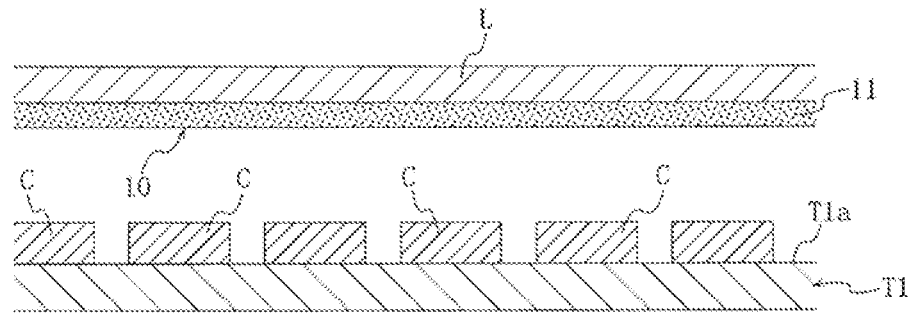
FIGS. 2(a) to 2(c) show part of steps in a semiconductor device-manufacturing method carried out by using the sinter-bonding sheet shown in FIG. 1.

In the present method, first, as shown in FIG. 2(a), the sinter-bonding sheet 10 and a plurality of semiconductor chips C are provided. The sinter-bonding sheet 10 has an adhesive layer 11 having the above-mentioned constitution composed of the sinter-bonding composition according to the present invention, and has a release liner L on one surface thereof. Each of the plurality of semiconductor chips C has predetermined semiconductor elements already built therein, and is fixed on the adhesive face T1a of a chip-fixing tape T1. In each semiconductor chip C, the surface (in FIGS. 2(a) to 2(c), the upper face) on the side where the sinter-bonding sheet 10 is to be laminated has a planar electrode as an external electrode (not shown) already formed thereon. The thickness of the planar electrode is, for example, 10 to 1,000 nm. The planar electrode is composed, for example, of silver. The planar electrode may be laminated and formed on a titanium thin film formed on the semiconductor chip surface. The thickness of the titanium thin film is, for example, 10 to 1,000 nm. These planar electrode and titanium thin film can be formed, for example, by a vapor deposition method. Further the other face (in FIGS. 2(a) to 2(c), the lower face) of each semiconductor chip C, as required, has another electrode pad or the like (not shown) formed thereon.

Figure 2B:
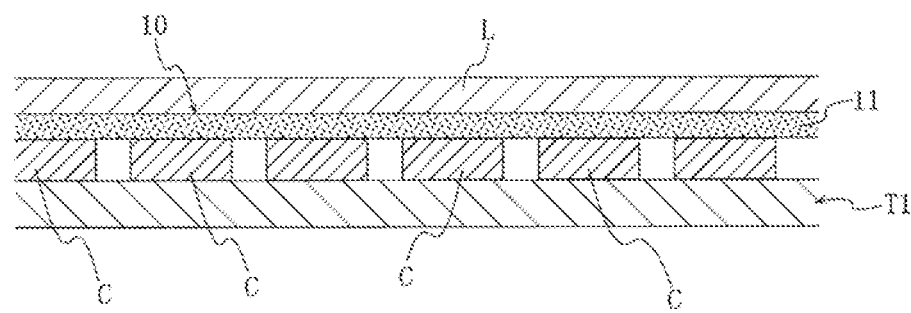

Then, as shown in FIG. 2(b), the sinter-bonding sheet 10 is laminated on the plurality of semiconductor chips C. Specifically, the sinter-bonding sheet 10 or the adhesive layer 11 is laminated on the plurality of semiconductor chips C while the sinter-bonding sheet 10 is pressed from the release liner L side toward the semiconductor chip C side. Examples of the pressurizing means include pressure-bonding rolling. The laminating temperature is, for example, 50 to 90° C., and the laminating load is, for example, 0.01 to 5 MPa.

Figure 2C:
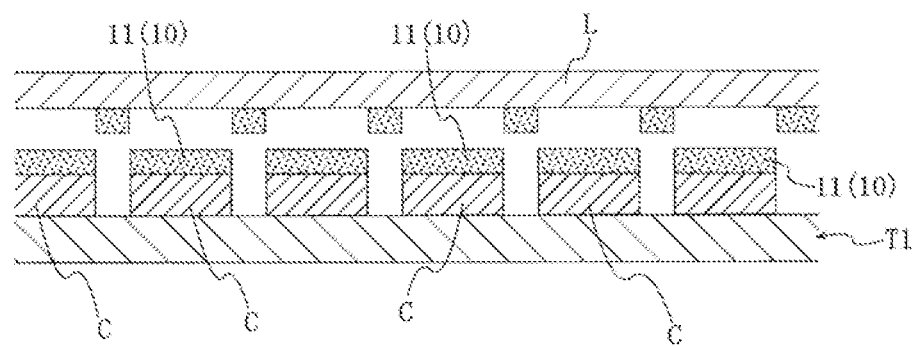

Then, as shown in FIG. 2(c), the release liner L is released. Each corresponding portion of the sinter-bonding sheet 10 or its adhesive layer 11 is thereby transferred to the surface of each semiconductor chip C to thereby obtain the semiconductor chips C each having the chip-size sinter-bonding sheet 10.

Figure 3A:
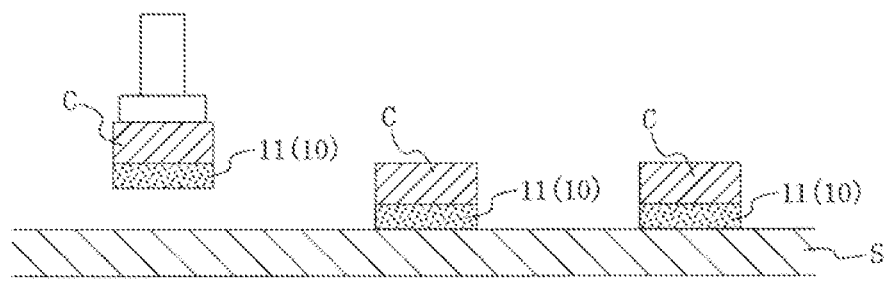
FIGS. 3(a) and 3(b) show part of steps in the semiconductor device-manufacturing method carried out by using the sinter-bonding sheet shown in FIG. 1.

Then, as shown in FIG. 3(a), the semiconductor chips C are temporarily fixed on a support substrate S (temporary fixation step). Specifically, the semiconductor chips C with the sinter-bonding sheet are pressed and temporarily fixed onto the support substrate S through the sinter-bonding sheet 10 by using, for example, a chip mounter. Examples of the support substrate S include insulating circuit substrates having wiring such as copper wiring on the surface thereof, and lead frames. The chip mounting place on the support substrate S may be a bare surface of the copper wiring, the lead frame or the like, or may be a surface of a plating film formed on the bare surface. Examples of the plating film include gold plating films, silver plating films, nickel plating films, palladium plating films and platinum plating films. In the present step, the temperature condition of the temporary fixation is, for example, 70° C. and 50 to 90° C. in the temperature range including its vicinity; and the pressurizing load condition is, for example, 0.01 to 5 MPa; and the boding time is, for example, 0.01 to 5 s.

Figure 3B:
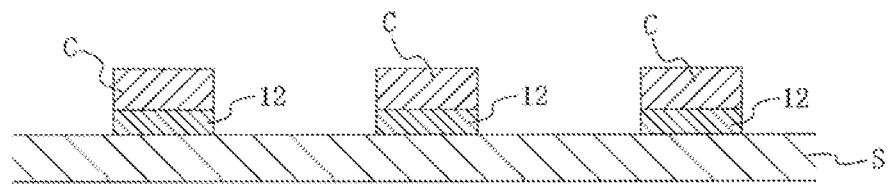

Then, as shown in FIG. 3(b), the resultant was subjected to a high-temperature heating process to thereby cause the semiconductor chips C to be bonded to the support substrate S (sinter-bonding step). Specifically, by subjecting the resultant to a predetermined high-temperature heating process to thereby, between the support substrate S and the semiconductor chips C, evaporate the low-boiling point binder in the adhesive layer 11, thermally decomposing and evaporating the thermally decomposable polymeric binder, and sinter the electroconductive metal of the sinterable particles. A sintered layer 12 is thereby formed between the support substrate S and each semiconductor chip C to thereby bond the semiconductor chip C to the support substrate S while making electric connection with the support substrate S side. In the present step, the temperature condition of the sinter-bonding is, for example, 300° C. and 200 to 400° C. in the range including its vicinity, and preferably 330 to 350° C. The pressurizing condition of the sinter-bonding is, for example, 40 MPa or less, preferably 20 MPa or less, more preferably 15 MPa or less, more preferably 12 MPa or less and more preferably 10 MPa or less. Then the sinter-bonding time is, for example, 0.3 to 300 min, and preferably 0.5 to 240 min. The temperature profile and the pressure profile to carry out the sinter-bonding step are suitably set, for example, in the range of these conditions. The sinter-bonding step described above can be carried out by using an apparatus which can simultaneously carry out heating and pressurizing. Examples of such an apparatus include flip chip bonders and parallel flat plate presses. Further from the viewpoint of preventing oxidation of the metal participating in the sinter-bonding, the present step is preferably carried out in any of a nitrogen atmosphere, a reduced pressure and a reducing gas atmosphere.

Figure 4A:
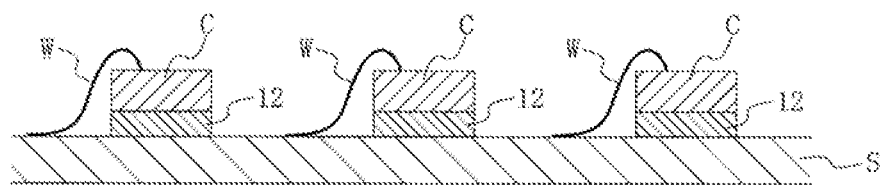
FIGS. 4(a) and 4(b) show part of steps in a semiconductor device-manufacturing method carried out by using the sinter-bonding sheet shown in FIG. 1.

In the manufacture of the semiconductor device, then, as shown in FIG. 4(a), the above electrode pad (not shown) of each semiconductor chip C and a terminal part (not shown) which the support substrate S has are, as required, electrically connected through a bonding wire W (wire bonding step). Connection of the electrode pad of the semiconductor chip C and the terminal part of the support substrate S with the bonding wire W is made, for example, by ultrasonic welding involving heating. As the bonding wire W, for example, a gold wire, an aluminum wire or a copper wire can be used. The wire heating temperature in the wire bonding is, for example, 80 to 250° C., and preferably 80 to 220° C. Then the heating time is several seconds to several minutes.

Figure 4B:
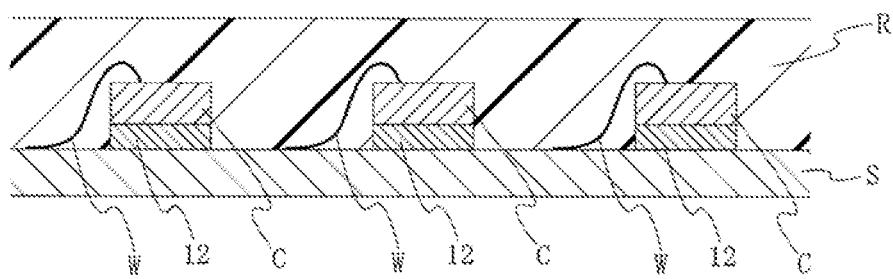

Then, as shown in FIG. 4(b), a sealing resin R for protecting the semiconductor chips C and the bonding wires W on the support substrate S is formed (sealing step). In the present step, the sealing resin R is formed, for example, by a transfer molding technology to be carried out by using a metal mold. As a constituent of the sealing resin R, for example, an epoxy resin can be used. In the present step, the heating temperature for forming the sealing resin R is, for example, 165 to 185° C.; and the heating time is, for example, 60 s to several minutes. When in the present sealing step, curing of the sealing resin R does not sufficiently progress, after the present step, a post-curing step is carried out for completely curing the sealing resin R.

As in the above, the semiconductor device can be manufactured through the processes using the sinter-bonding sheet 10.

Figure 5:
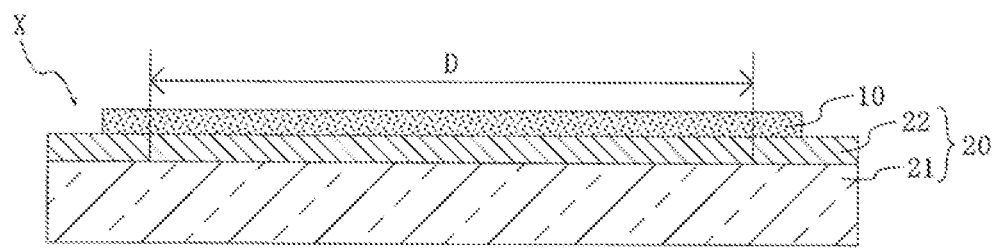
FIG. 5 is a partial cross-sectional schematic view of a dicing tape with a sinter-bonding sheet according to one embodiment of the present invention.

FIG. 5 is a cross-sectional schematic view of a dicing tape with a sinter-bonding sheet, X, according to one embodiment of the present invention. The dicing tape with a sinter-bonding sheet, X, has a lamination structure containing the above-mentioned sinter-bonding sheet 10 according to one embodiment of the present invention and a dicing tape 20, and can be used for obtaining semiconductor chips having a chip-size sinter-bonding sheet in manufacture of a semiconductor device. Then the dicing tape with a sinter-bonding sheet, X, has, for example, a shape, for example, of a disc, in a size corresponding to a semiconductor wafer as a workpiece in the manufacture process of the semiconductor device.

The dicing tape 20 has a lamination structure containing a base material 21 and an adhesive layer 22.

The base material 21 of the dicing tape 20 is an element functioning as a support in the dicing tape 20 or the dicing tape with a sinter-bonding sheet, X. As the base material 21, For example, plastic base materials such as plastic films can be used. Examples of constituent materials of the plastic base materials include polyvinyl chloride, polyvinylidene chloride, polyolefin, polyester, polyurethane, polycarbonate, polyether ether ketone, polyimide, polyetherimide, polyamide, wholly aromatic polyamide, polyphenyl sulfide, aramid, fluororesins, cellulose-based resins and silicone resins. Examples of the polyolefin include low-density polyethylene, linear polyethylene, medium-density polyethylene, high-density polyethylene, ultralow-density polyethylene, random copolymerized polypropylene, block copolymerized polypropylene, homopolypropylene, polybutene, polymethylpentene, ethylene-vinylacetate copolymers, ionomer resins, ethylene-(meth)acrylic acid copolymers, ethylene-(meth)acrylate copolymers, ethylene-butene copolymers and ethylene-hexene copolymers. Examples of the polyester include polyethylene terephthalate (PET), polyethylene naphthalate and polybutylene terephthalate (PBT). The base material 21 may be composed of one material, or may be composed of two or more materials. The base material 21 may have a single layer structure, or may have a multilayer structure. When the adhesive layer 22 on the base material 21 is of an ultraviolet curing type, the base material 21 preferably has ultraviolet transmissivity. The base material 21, in the case of being a plastic film, may be a non-stretched film, a uniaxially stretched film or a biaxially stretched film.

The surface on the adhesive layer 22 side of the base material 21 may be a surface having been subjected to a treatment for enhancing the adhesiveness with the adhesive layer 22. Examples of such a treatment include physical treatments such as corona discharge treatment, plasma treatment, sand-matting treatment, ozone exposure treatment, flame exposure treatment, high-voltage shock exposure treatment and ionizing radiation treatment, chemical treatments such as chromic acid treatment, and undercoating treatments.

The thickness of the base material 21 is, from the viewpoint of securing the strength enough for the base material 21 to function as a support in the dicing tape 20 or the dicing tape with a sinter-bonding sheet, X, preferably 40 µm or more, more preferably 50 µm or more, more preferably 55 µm or more and more preferably 60 µm or more. Further the thickness of the base material 21 is, from the viewpoint of materializing suitable flexibility in the dicing tape 20 or the dicing tape with a sinter-bonding sheet, X, preferably 200 µm or less, more preferably 180 µm or less and more preferably 150 µm or less.

The adhesive layer 22 of the dicing tape contains an adhesive. As the adhesive, for example, an acrylic adhesive containing an acrylic polymer as a base polymer, or a rubber-based adhesive can be used. Further the adhesive may be an adhesive (adhesive strength-reducing type adhesive) whose adhesive strength is capable of being intentionally reduced by an action from the outside, such as heating or radiation irradiation, or may be an adhesive (adhesive strength-non-reducing type adhesive) whose adhesive strength is almost not or not at all reduced by an action from the outside. Examples of the adhesive strength-reducing type adhesive include radiation-curing type adhesives (adhesives having radiation curability), and heat-foaming type adhesives. Examples of the adhesive strength-non-reducing type adhesive include pressure-sensitive adhesives.

When the adhesive layer 22 contains an acrylic adhesive, an acrylic polymer as a base polymer of the acrylic adhesive preferably contains, as a monomer unit contained in the highest mass proportion, a monomer unit originated from alkyl acrylates and/or alkyl methacrylates.

Examples of the alkyl methacrylates to make the monomer unit of the acrylic polymer include alkyl (meth)acrylates having a straight-chain or branched alkyl group, and cycloalkyl (meth)acrylates. Examples of the alkyl (meth) acrylates include a methyl ester of (meth)acrylic acid, an ethyl ester, a propyl ester, an isopropyl ester, a butyl ester, an isobutyl ester, an s-butyl ester, a t-butyl ester, a pentyl ester, an isopentyl ester, a hexyl ester, a heptyl ester, an octyl ester, a 2-ethylhexyl ester, an isooctyl ester, a nonyl ester, a decyl ester, an isodecyl ester, an undecyl ester, a dodecyl ester, a tridecyl ester, a tetradecyl ester, a hexadecyl ester, an octadecyl ester and an eicosyl ester thereof. Examples of the cycloalkyl (meth)acrylates include a cyclopentyl ester of (meth)acrylic acid, and a cyclohexyl ester thereof. As the alkyl (meth)acrylate for the acrylic polymer, one alkyl (meth)acrylate may be used or two or more alkyl (meth) acrylates may be used. The proportion of the alkyl (meth) acrylates in all monomer components for forming the acrylic polymer is, in order to make the alkyl (meth)acrylates to suitably develop basic characteristics including tackiness in the adhesive layer 22, for example, 50% by mass or more.

The acrylic polymer, in order to improve its cohesive strength, heat resistance and the like, may contain a monomer unit originated from other monomers copolymerizable with the alkyl (meth)acrylates. Examples of such monomers include carboxy group-containing monomers, acid anhydride monomers, hydroxy group-containing monomers, sulfonic acid group-containing monomers, phosphoric acid group-containing monomers, acrylamide, and acrylonitrile.

Examples of the carboxy group-containing monomers include acrylic acid, methacrylic acid, carboxyethyl (meth) acrylate, carboxypentyl (meth)acrylate, itaconic acid, maleic acid, fumaric acid and crotonic acid. Examples of the acid anhydrides include maleic anhydride and itaconic anhydride. Examples of the hydroxy group-containing monomers include 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth) acrylate and 4-(hydroxymethyl)cyclohexylmethyl (meth) acrylate. Examples of the sulfonic acid group-containing monomers include styrenesulfonic acid, allylsulfonic acid, 2-(meth)acrylamido-2-methylpropanesulfonic acid, (meth) acrylamidopropanesulfonic acid, sulfopropyl (meth)acrylate and (meth)acryloyloxynaphthalenesulfonic acid. Examples of the phosphoric acid group-containing monomers include 2-hydroxyethylacryloyl phosphate. As the other monomers for the acrylic polymer, one monomer may be used or two or more monomers may be used. The proportion of monomers other than the alkyl (meth)acrylates in all monomer components for forming the acrylic polymer is, in order to make the alkyl (meth)acrylates to suitably develop basic characteristics including tackiness in the adhesive layer 22, for example, 50% by mass or more.

The acrylic polymer, in order to form a crosslinked structure in its polymer skeleton, may contain a monomer unit originated from polyfunctional monomers copolymerizable with the alkyl (meth)acrylates. Examples of such polyfunctional monomers include hexanediol di(meth)acrylate, (poly)ethylene glycol di(meth)acrylate, (poly)propylene glycol di(meth)acrylate, neopentyl glycol di(meth)acrylate, pentaerythritol di(meth)acrylate, trimethylolpropane tri (meth)acrylate, pentaerythritol tri(meth)acrylate, dipentaerythritol hexa(meth)acrylate, epoxy (meth)acrylate, glycidyl (meth)acrylate, polyester (meth)acrylate and urethane (meth)acrylate. As the polyfunctional monomers for the acrylic polymer, one polyfunctional monomer may be used, or two or more polyfunctional monomers may be used. The proportion of polyfunctional monomers in all monomer components for forming the acrylic polymer is, in order to make the alkyl (meth)acrylates to suitably develop basic characteristics including tackiness in the adhesive layer 22, for example, 40% by mass or less.

The acrylic polymer can be obtained by polymerizing raw material monomers for forming it. Examples of polymerizing methods include solution polymerization, emulsion polymerization, bulk polymerization and suspension polymerization. From the viewpoint of high cleanability in the semiconductor device manufacturing method using the dicing tape 20 or the dicing tape with a sinter-bonding sheet, X, it is better that less are low-molecular weight components in the adhesive layer 22 in the dicing tape 20 or the dicing tape with a sinter-bonding sheet, X, and the number-average molecular weight of the acrylic polymer is, for example 100,000 or more.

The adhesive layer 22 or the adhesive for making this, in order to raise the number-average molecular weight of the base polymer including the acrylic polymer, may contain, for example, an external crosslinking agent. The external crosslinking agent for reacting with the base polymer including the acrylic polymer to thereby form a crosslinked structure includes polyisocyanate compounds, epoxy compounds, aziridine compounds and melamine-based crosslinking agents. The content of the external crosslinking agent in the adhesive layer 22 or the adhesive for making this is, for example, 5 parts by mass or less per 100 parts by mass of the base polymer.

The adhesive layer 22 may be a radiation-curing type adhesive layer in which when the adhesive layer is irradiated with radiation such as ultraviolet rays, the degree of crosslinking of the irradiation site is raised and the adhesive strength is reduced. Examples of radiation-curing type adhesives for making such an adhesive layer include addition-type radiation-curing type adhesives containing the above-mentioned base polymer including the acrylic polymer, and radiation-polymerizable monomer components or oligomer components having radiation-polymerizable functional groups such as carbon-carbon double bonds.

Examples of the radiation-polymerizable monomer components include urethane (meth)acrylate, trimethylolpropane tri(meth)acrylate, pentaerythritol tri(meth)acrylate, pentaerythritol tetra(meth)acrylate, dipentaerythritol monohydroxypenta(meth)acrylate, dipentaerythritol hexa(meth) acrylate and 1,4-butanediol di(meth)acrylate. Examples of the radiation-polymerizable oligomer components include various oligomers of urethane-based, polyether-based, polyester-based, polycarbonate-based and polybutadiene-based ones and the like, and ones having a molecular weight of about 100 to 30,000 are suitable. The content of the radiation-polymerizable monomer components and oligomer components in the adhesive layer 22 or the radiation-curing type adhesive for making this is determined in such a range that the adhesive strength of the adhesive layer 22 to be formed can suitably be reduced, and is, for example, 40 to 150 parts by mass per 100 parts by mass of the base polymer including the acrylic polymer. Then as the addition-type radiation-curing type adhesive, for example, one disclosed in Japanese Patent Laid-Open No. 60-196956 may be used.

Examples of the radiation-curing type adhesive for making the adhesive layer 22 include intrinsic-type radiation-curing type adhesives containing a base polymer having functional groups such as radiation-polymerizable carbon-carbon double bonds in polymer side chains, polymer main chain or polymer main chain terminals. Such intrinsic-type radiation-curing type adhesives are suitable for suppressing unintended temporal changes of tackiness characteristics caused by transfer of low-molecular weight components in the adhesive layer 22 to be formed.

As the base polymer contained in the intrinsic-type radiation-curing type adhesive, preferable is one having an acrylic polymer as its basic skeleton. As such an acrylic polymer making the basic skeleton, the above-mentioned acrylic polymer can be adopted. Examples of a method of introducing radiation-polymerizable carbon-carbon double bonds to the acrylic polymer include a method in which raw material monomers containing a monomer having a predetermined functional group (first functional group) are copolymerized to thereby obtain an acrylic polymer, and thereafter, a compound having a predetermined functional group (second functional group) to cause a reaction with the first functional group and a radiation-polymerizable carbon-carbon double bond is subjected to a condensation reaction or an addition reaction with the acrylic polymer with the radiation reactivity of the carbon-carbon double bond being retained.

Examples of combinations of the first functional group and the second functional group include a carboxy group and an epoxy group, an epoxy group and a carboxy group, a carboxy group and an aziridyl group, an aziridyl group and a carboxy group, a hydroxy group and an isocyanate group, and an isocyanate group and a hydroxy group. Among these combinations, from the viewpoint of easiness in reaction monitoring, suitable are the combination of a hydroxy group and an isocyanate group and the combination of an isocyanate group and a hydroxy group. Then since the fabrication of a polymer having a highly reactive isocyanate group is high in the degree of technical difficulty, from the viewpoint of easiness in fabrication or availability of an acrylic polymer, the case is more suitable where the first functional group of the acrylic polymer is a hydroxy group and the second functional group is an isocyanate group. In this case, examples of isocyanate compounds simultaneously having a radiation-polymerizable carbon-carbon double bond and an isocyanate group as the second functional group include methacryloyl isocyanate, 2-methacryloyloxyethyl isocyanate and m-isopropenyl-α, α-dimethylbenzyl isocyanate. Further as the acrylic polymer having the first functional group, suitable are ones containing a monomer unit originated from the above hydroxy-containing monomers, and also ones containing a monomer unit originated from ether-based compounds such as 2-hydroxyethyl vinyl ether, 4-hydroxybutyl vinyl ether and diethylene glycol monovinyl ether.

The radiation-curing type adhesive for making the adhesive layer 22 preferably contains a photopolymerization initiator. Examples of the photopolymerization initiator include α-ketol-based compounds, acetophenone-based compounds, benzoin ether-based compounds, ketal-based compounds, aromatic sulfonyl chloride-based compounds, photoactive oxime-based compounds, benzophenone-based compounds, thioxanthone-based compounds, camphor quinones, halogenated ketones, acyl phosphinoxide and acyl phosphonate. Examples of the α-ketol-based compounds include 4-(2-hydroxyethoxy)phenyl (2-hydroxy-2-propyl) ketone, α-hydroxy-α,α'-dimethylacetophenone, 2-methyl-2-hydroxypropiophenone and 1-hydroxycyclohexyl phenyl ketone. Examples of the acetophenone-based compounds include methoxyacetophenone, 2,2-dimethoxy-2-phenylacetophenone, 2,2-diethoxyacetophenone and 2-methyl-1-[4-(methylthio)-phenyl]-2-morpholinopropane-1. Examples of the benzoin ether-based compounds include benzoin ethyl ether, benzoin isopropyl ether and anisoin methyl ether. Examples of the ketal-based compounds include benzyl dimethyl ketal. Examples of the aromatic sulfonyl chloride-based compounds include 2-naphthalenesulfonyl chloride. Examples of the photoactive oxime-based compounds include 1-phenone-1,2-propanedione-2-(O-ethoxycarbonyl) oxime. Examples of the benzophenone-based compounds include benzophenone, benzoyl benzoate and 3,3'-dimethyl-4-methoxybenzophenone. Examples of the thioxanthone-based compounds include thioxanthone, 2-chlorothioxanthone, 2-methylthioxanthone, 2,4-dimethylthioxanthone, isopropylthioxanthone, 2,4-dichlorothioxanthone, 2,4-diethylthioxanthone and 2,4-diisopropylthioxanthone. The content of the photopolymerization initiator in the radiation-curing type adhesive for making the adhesive layer 22 is, for example, 0.05 to 20 parts by mass per 100 parts by mass of the base polymer including the acrylic polymer.

The adhesive layer 22 or the adhesive for making this may contain, in addition to the above components, additives such as a crosslinking accelerator, a tackifier, an antioxidant, and a colorant. The colorant may be a compound to be colored by being irradiated with radiation. Example of such a compound include leuco dyes.

The thickness of the adhesive layer 22 is, from the viewpoint of the balance of the adhesive strength of the adhesive layer 22 before and after radiation curing to the sinter-bonding sheet 10, for example, 1 to 50 μm.

The dicing tape with a sinter-bonding sheet, X, having the above constitution can be fabricated, for example, as follows.

The dicing tape 20 of the dicing tape with a sinter-bonding sheet, X, can be fabricated by providing the adhesive layer 22 on the base material 21 provided. For example, a resin-made base material 21 can be fabricated by a film-forming method such as a calendar film-forming method, a casting method in an organic solvent, an inflation method in a closed system, a T-die method, a coextrusion method or a dry lamination method. The adhesive layer 22 can be formed by preparing an adhesive composition for forming the adhesive layer 22, thereafter applying the adhesive composition on the base material 21 or a predetermined separator (that is, a release liner) to thereby form an adhesive composition layer, and as required, drying the adhesive composition layer (at this time, as required, thermally crosslinked). Examples of an applying method of the adhesive composition include roll coating, screen coating and bravura coating. The temperature for drying the adhesive composition layer is, for example, 80 to 150° C.; and the time therefor is, for example, 0.5 to 5 min. When the adhesive layer 22 is formed on the separator, the adhesive layer 22 with the separator is laminated on the base material 21. As described above, the dicing tape 20 can be fabricated.

The sinter-bonding sheet 10 of the dicing tape with a sinter-bonding sheet, X, can be fabricated, as described above, for example, by preparing a vanish for forming the sinter-bonding sheet 10, applying the vanish on the separator as a base material to thereby form a coating film, and drying the coating film.

In the fabrication of the dicing tape with a sinter-bonding sheet, X, then, the sinter-bonding sheet 10 is laminated on the adhesive layer 22 side of the dicing tape 20, for example, by pressure-bonding. The laminating temperature is, for example, 30 to 50° C.; and the laminating pressure (linear pressure) is, for example, 0.1 to 20 kgf/cm. When the adhesive layer 22 is a radiation-curing type adhesive layer as described above, then, the adhesive layer 22 may be irradiated with radiation such as ultraviolet rays, for example, from the base material 21 side. The irradiation quantity is, for example, 50 to 500 mJ/cm$^2$, and preferably 100 to 300 mJ/cm$^2$. A region in the dicing tape with a sinter-bonding sheet, X, where irradiation is carried out as a measure to reduce the adhesive strength of the adhesive layer 22 (irradiation region D) is, for example, a region, in the sinter-bonding sheet-laminated region in the adhesive layer 22, excluding its peripheral part.

As described above, the dicing tape with a sinter-bonding sheet, X, for example, shown in FIG. 5, can be fabricated. In the dicing tape with a sinter-bonding sheet, X, the separator (not shown) may be provided so as to cover the adhesive layer 22 having the sinter-bonding sheet 10. The separator is an element for protection such that the adhesive layer 22 and the sinter-bonding sheet 10 are not exposed, and before the dicing tape with a sinter-bonding sheet, X, is used, is separated from the film. As the separator, polyethylene terephthalate (PET) films, polyethylene films, polypropylene films, various plastic films and papers surface-coated with a release agent (for example, a fluorine-containing release agent or a long-chain alkyl acrylate-based release agent), and the like can be used.

Figure 6A:
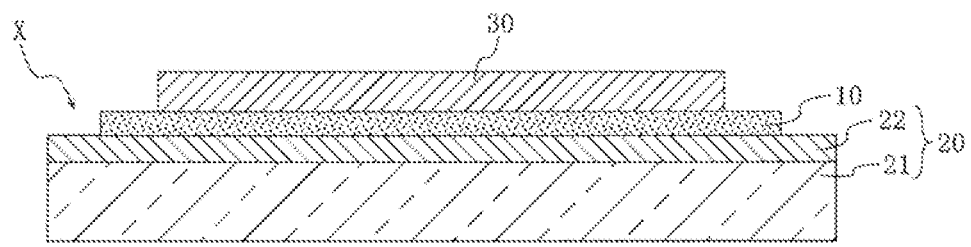
FIGS. 6(a) and 6(b) show part of steps in a semiconductor device-manufacturing method carried out by using the dicing tape with a sinter-bonding sheet shown in FIG. 5.
Figure 6B:
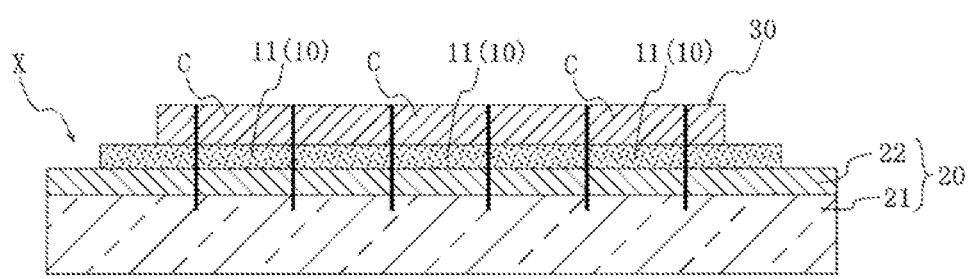

FIGS. 6(a) and 6(b) shows part of steps of the semiconductor device-manufacturing method carried out by using the dicing tape with a sinter-bonding sheet, X.

In the present method, first, as shown in FIG. 6(a), a semiconductor wafer 30 is laminated on the sinter-bonding sheet 10 of the dicing tape with a sinter-bonding sheet, X. Specifically, the semiconductor wafer 30 is pressed onto the sinter-bonding sheet 10 side of the dicing tape with a sinter-bonding sheet, X, by a pressure-bonding roll or the like to be thereby laminated on the dicing tape with a sinter-bonding sheet, X, or the sinter-bonding sheet 10. The semiconductor wafer 30 is one having a plurality of semiconductor elements built therein, and the surface of the side thereof which is laminated onto the sinter-bonding sheet 10 (in FIGS. 6(a) and 6(b), the lower surface) has a planar electrode (not shown) as an external electrode already formed thereon. The thickness of the planar electrode is, for example, 10 to 1,000 nm. The planar electrode is composed, for example, of silver. Further the planar electrode may be laminated and formed on a titanium thin film formed on the semiconductor wafer surface. The thickness of the titanium thin film is, for example, 10 to 1,000 nm. These planar electrode and the titanium thin film can be formed, for example, by a vapor deposition method. Further on the other face (in FIGS. 6(a) and 6(b), the upper face) of the semiconductor wafer 30, as required, another electrode pad (not shown) is formed for each semiconductor element. In the present step, the laminating temperature is, for example, 50 to 90° C.; and the laminating load is, for example, 0.01 to 10 MPa. When the adhesive layer 22 in the dicing tape with a sinter-bonding sheet, X, is a radiation-curing type adhesive layer, in place of the above-mentioned radiation irradiation in the manufacturing process of the dicing tape with a sinter-bonding sheet, X, after the lamination of the semiconductor wafer 30 on the dicing tape with a sinter-bonding sheet, X, the adhesive layer 22 may be irradiated with radiation such as ultraviolet rays from the base material 21 side. The irradiation quantity is, for example, 50 to 500 mJ/cm$^2$, and preferably 100 to 300 mJ/cm$^2$. A region (in FIG. 5, as indicated as an irradiation region D) in the dicing tape with a sinter-bonding sheet, X, where irradiation is carried out as a measure to reduce the adhesive strength of the adhesive layer 22 is, for example, a region, in the sinter-bonding sheet-laminated region in the adhesive layer 22, excluding its peripheral part.

Then, as shown in FIG. 6(b), dicing is carried out on the semiconductor wafer 30. Specifically, the semiconductor wafer 30 is diced by using a rotating blade of a dicing apparatus or the like in a state where the semiconductor wafer 30 is held on the dicing tape with a sinter-bonding sheet, X, to be thereby singulated into semiconductor chip units (in the figure, cut portions are schematically represented by heavy lines). Semiconductor chips C each having the chip-size sinter-bonding sheet 10 are thus formed.

Then, the semiconductor chips C side of the dicing tape 20 having the semiconductor chips C each having the sinter-bonding sheet is, as required, subjected to a cleaning step of cleaning by using a cleaning liquid, and thereafter, the semiconductor chips C each having the sinter-bonding sheet are picked up from the dicing tape 20 (picking-up step). For example, the semiconductor chips C each having the sinter-bonding sheet as objects to be picked up are, for example, pushed up through the dicing tape 20 elevating pin members (not shown) of a picking-up mechanism from the lower side in the figure of the dicing tape 20, and thereafter, adsorbed and held by adsorbing jigs (not shown).

Then, as shown in FIG. 3(a), the semiconductor chips C are temporarily fixed on the support substrate S (temporary fixation step), and as shown in FIG. 3(b), subjected to a high-temperature heating process for sinter-bonding to thereby bond the semiconductor chips C to the support substrate S (sinter-bonding step). Specific embodiments and specific conditions of these steps are the same as those above-mentioned referring to FIG. 3(a) and FIG. 3(b) with regard to the temporary fixation step and the sinter-bonding step in the semiconductor device-manufacturing method carried out by using the sinter-bonding sheet 10.

Then, as shown in FIG. 4(a), the above electrode pad (not shown) of each semiconductor chip C and a terminal part (not shown) which the support substrate S has are, as required, electrically connected through a bonding wire W (wire bonding step). Then, as shown in FIG. 4(b), a sealing resin R for protecting the semiconductor chips C and the bonding wires W on the support substrate S is formed (sealing step). Specific embodiments and specific conditions of these steps are the same as those above-mentioned referring to FIG. 4(a) and FIG. 4(b) with regard to the wire bonding step and the sealing step in the semiconductor device-manufacturing method carried out by using the sinter-bonding sheet 10.

As described above, the semiconductor device can be manufactured through the process using the dicing tape with a sinter-bonding sheet, X.

The sinterable particles containing an electroconductive metal contained in the adhesive layer 11 of the sinter-bonding sheet 10 or the sinter-bonding composition making this have a particle size distribution constitution in which as described above, the average particle diameter is 2 μm or less and the proportion of particles having a particle diameter of 100 nm or less is 80% by mass or more. The proportion is, as described above, preferably 85% by mass or more and more preferably 90% by mass or more. Such a constitution of the particle size distribution of the sinterable particles is suitable for forming the high-density sintered layer 12 from the sinter-bonding composition making the adhesive layer 11 by sintering under the low-loading condition. According to the above constitution of the particle size distribution of the sinterable particles having an average particle diameter of 2 μm or less, when the content proportion of the sinterable particles in the sinter-bonding composition making the adhesive layer 11 is, for example, as high as 85% by mass or more, it is conceivable that a group of particles thereof having a particle diameter of 100 nm or less and a group of particles thereof having a particle diameter of more than 100 nm in the composition assume a close packing state and the gross contact area among particles becomes easily large. The larger the gross contact area among the sinterable particles, the lower the loading conditions including the pressurizing condition for suitably integrating the sinterable particles are likely to become.

Then, the higher the density of the sintered layer 12 to be formed from the composition containing the sinterable particles containing an electroconductive metal, the higher bonding reliability is likely to be attained in the sintered layer 12. The adhesive layer 11 or the sinter-bonding composition making this suitable for materializing sinter-bonding by the high-density sintered layer under the low-loading condition is suitable for materializing a high bonding reliability by the high-density sintered layer 12 through the sintering process under the low-loading condition.

As described above, the above-mentioned adhesive layer 11 of the sinter-bonding sheet 10 or sinter-bonding composition making this is suitable for materializing sinter-bonding by the high-density sintered layer 12 under the low-loading condition, and is therefore suitable for materializing a high bonding reliability by the high-density sintered layer 12 through the sintering process under the low-loading condition. Such a sinter-bonding sheet 10 is preferable from the viewpoint of the improvement of the production efficiency of an object to be manufactured.

The content proportion of the sinterable particles in the adhesive layer 11 of the sinter-bonding sheet 10 or the sinter-bonding composition making this is, as described above, preferably 90 to 98% by mass, more preferably 92 to 98% by mass and more preferably 94 to 98% by mass. Such a constitution is suitable for attaining a high density of the sintered layer 12 to be formed.

The porosity of the adhesive layer 11 of the sinter-bonding sheet 10 or the sinter-bonding composition making this is, as described above, preferably 10% or less, more preferably 8% or less, more preferably 6% or less and more preferably 4% or less. Then, the porosity of the adhesive layer 11 of the sinter-bonding sheet 10 or the sinter-bonding composition making this after undergoing sintering under conditions of 300° C., 10 MPa and 2.5 min is, as described above, preferably 10% or less, more preferably 8% or less, more preferably 6% or less and more preferably 4% or less. Such a constitution is suitable for attaining a high density of the sintered layer 12 to be formed.

The adhesive layer 11 of the sinter-bonding sheet 10 or the sinter-bonding composition making this, as described above, contains, together with the above-mentioned sinterable particles containing an electroconductive metal, preferably, a thermally decomposable polymeric binder; and the weight-average molecular weight of the thermally decomposable polymeric binder is preferably 10,000 or more. According to such a constitution, the cohesive strength of the adhesive layer 11 is easily secured, for example, by utilizing the viscoelasticity of the thermally decomposable polymeric binder, at the temporarily fixing temperature in the above temporary fixation step, that is, at 70° C. and 50 to 90° C. in the temperature range including the vicinity, and the adhesive strength of the adhesive layer 11 is therefore easily secured.

The thermally decomposable polymeric binder contained in the adhesive layer 11 of the sinter-bonding sheet 10 or the sinter-bonding composition making this is, as described above, preferably a polycarbonate resin and/or an acrylic resin. Since it is easy to provide the polycarbonate resin and the acrylic resin as a polymeric binder which is decomposed and volatilized at a temperature of about 300° C., the constitution is suitable for reducing organic residues in the sintered layer 12 to be formed between the support substrate S and the semiconductor chips C to be sinter-bonded by using the sinter-bonding sheet 10. The less the organic residues in the sintered layer 12, the firmer the sintered layer 12 is likely to be, and therefore, an excellent bonding reliability is easily attained in the sintered layer 12.

Since the sinter-bonding sheet 10 is supplied in the form of a sheet of the sinter-bonding material, which is easily fabricated in a uniform thickness, use of the sinter-bonding sheet 10 enables the support substrate S and the semiconductor chips C to be bonded to the sintered layer 12 having a uniform thickness. The sinter-bonding by the sintered layer 12 having a uniform thickness is suitable for materializing a high bonding reliability of the semiconductor chips C to the support substrate S.

Further the sinter-bonding sheet 10, since the sinter-bonding material is supplied in the form of a sheet which is unlikely to fluidize, is suitable for sinter-bonding the semiconductor chips C onto the support substrate S while the protruding of the sintering metal from between the support substrate S and the semiconductor chips C as objects to be bonded, and the creeping-up of the sintering metal onto the semiconductor chip C side faces are suppressed. Suppression of such protruding and creeping-up is suitable for improving the yield in the manufacture of the semiconductor device involving sinter-bonding.

EXAMPLES

Example 1

53.78 parts by mass of first silver particles (average particle diameter: 60 nm, particle size distribution: 5 to 100 nm, manufactured by DOWA Electronics Materials Co., Ltd.) as a sinterable particle, 5.976 parts by mass of second silver particles (average particle diameter: 1,100 nm, particle size distribution: 400 to 5,000 nm, manufactured by Mitsui Mining & Smelting Co., Ltd.) as a sinterable particle, 0.87 parts by mass of a polycarbonate resin (trade name: "QPAC40", weight-average molecular weight: 150,000, solid at normal temperature, manufactured by Empower Materials Co., Ltd.) as a thermally decomposable polymeric binder, 3.47 parts by mass of isobornylcyclohexanol (trade name: "Tersolve MTPH", liquid at normal temperature, manufactured by Nippon Terpene Chemicals, Inc.) as a low-boiling point binder, and 35.91 parts by mass of methyl ethyl ketone as a solvent were mixed by a hybrid mixer (trade name: "HM-500", manufactured by Keyence Corp.) in its stirring mode to thereby prepare a vanish. The stirring time was set at 3 min. Then, the obtained vanish was applied and thereafter dried on a release-treated film (trade name: "MRA50", manufactured by Mitsubishi Plastics, Inc.) to thereby form an adhesive layer of 40 μm in thickness for sinter-bonding, that is, a sheet body of 40 μm in thickness of a sinter-bonding composition. The drying temperature was set at 110° C. and the drying time was set at 3 min. A sinter-bonding sheet of Example 1 having the adhesive layer containing the sinterable particles, the thermally decomposable polymeric binder and the low-boiling point binder was thus fabricated. The content proportion of the sinterable particles in the sinter-bonding sheet (sinter-bonding composition) of Example 1 was 93.2% by mass, and the proportion of the particles having a particle diameter of 100 nm or less in the sinterable particles was 90% by mass. The composition regarding such a sinter-bonding sheet of Example 1 is shown in Table 1 (also for Examples and Comparative Examples described later. In Table 1, the unit of each numerical value representing a composition was a relative "parts by mass".).

Example 2

61.29 parts by mass of first silver particles (average particle diameter: 60 nm, particle size distribution: 5 to 100 nm, manufactured by DOWA Electronics Materials Co., Ltd.) as a sinterable particle, 6.81 parts by mass of second silver particles (average particle diameter: 1,100 nm, particle size distribution: 400 to 5,000 nm, manufactured by Mitsui Mining & Smelting Co., Ltd.) as a sinterable particle, 0.75 parts by mass of a polycarbonate resin (trade name: "QPAC40", weight-average molecular weight: 150,000, solid at normal temperature, manufactured by Empower Materials Co., Ltd.) as a thermally decomposable polymeric binder, 3.02 parts by mass of isobornylcyclohexanol (trade name: "Tersolve MTPH", liquid at normal temperature, manufactured by Nippon Terpene Chemicals, Inc.) as a low-boiling point binder, and 28.13 parts by mass of methyl ethyl ketone as a solvent were mixed by a hybrid mixer (trade name: "HM-500", manufactured by Keyence Corp.) in its stirring mode to thereby prepare a vanish. The stirring time was set at 3 min. Then, the obtained vanish was applied and thereafter dried on a release-treated film (trade name: "MBA50", manufactured by Mitsubishi Plastics, Inc.) to thereby form an adhesive layer of 40 μm in thickness for sinter-bonding, that is, a sheet body of 40 μm in thickness of a sinter-bonding composition. The drying temperature was set at 110° C. and the drying time was set at 3 min. A sinter-bonding sheet of Example 2 having the adhesive layer containing the sinterable particles, the thermally decomposable polymeric binder and the low-boiling point binder was thus fabricated. The content proportion of the sinterable particles in the sinter-bonding sheet (sinter-bonding composition) of Example 2 was 95% by mass, and the proportion of the particles having a particle diameter of 100 nm or less in the sinterable particles was 90% by mass.

Example 3

A sinter-bonding sheet of Example 3 was fabricated as in the sinter-bonding sheet of Example 2, except for using 6.81 parts by mass of third silver particles (average particle diameter: 300 nm, particle size distribution: 145 to 1,700 nm, manufactured by DOWA Electronics Materials Co., Ltd.) in place of 6.81 parts by mass of the second silver particles (average particle diameter: 1,100 nm, particle size distribution: 400 to 5,000 nm, manufactured by Mitsui Mining & Smelting Co., Ltd.). The content proportion of the sinterable particles in the sinter-bonding sheet (sinter-bonding composition) of Example 3 was 95% by mass, and the proportion of the particles having a particle diameter of 100 nm or less in the sinterable particles was 90% by mass.

Example 4

A sinter-bonding sheet of Example 4 was fabricated as in the sinter-bonding sheet of Example 2, except for altering the amount of the first silver particles (average particle diameter: 60 nm, particle size distribution: 5 to 100 nm, manufactured by DOWA Electronics Materials Co., Ltd.) blended from 61.29 parts by mass to 68.1 parts by mass, and using no second silver particles. The content proportion of the sinterable particles in the sinter-bonding sheet (sinter-bonding composition) of Example 4 was 95% by mass, and the proportion of the particles having a particle diameter of 100 nm or less in the sinterable particles was 100% by mass.

Example 5

A sinter-bonding sheet of Example 5 was fabricated as in the sinter-bonding sheet of Example 2, except for using 61.29 parts by mass of fourth silver particles (average particle diameter: 20 nm, particle size distribution: 1 to 50 nm, manufactured by DOWA Electronics Materials Co., Ltd.) and 6.81 parts by mass of fifth silver particles (average particle diameter: 500 nm, particle size distribution: 80 to 3,000 nm, manufactured by Mitsui Mining & Smelting Co., Ltd.) in place of 61.29 parts by mass of the first silver particles and 6.81 parts by mass of the second silver particles. The content proportion of the sinterable particles in the sinter-bonding sheet (sinter-bonding composition) of Example 5 was 95% by mass, and the proportion of the particles having a particle diameter of 100 nm or less in the sinterable particles was 90% by mass.

Example 6

A sinter-bonding sheet of Example 6 was fabricated as in the sinter-bonding sheet of Example 1, except for altering the amount of the first silver particles (average particle diameter: 60 nm, particle size distribution: 5 to 100 nm, manufactured by DOWA Electronics Materials Co., Ltd.) blended from 53.78 parts by mass to 35.86 parts by mass, and using, in addition to the first silver particles and the second silver particles, 17.93 parts by mass of the fourth silver particles (average particle diameter: 20 nm, particle size distribution: 1 to 50 nm, manufactured by DOWA Electronics Materials Co., Ltd.). The content proportion of the sinterable particles in the sinter-bonding sheet (sinter-bonding composition) of Example 6 was 93.2% by mass, and the proportion of the particles having a particle diameter of 100 nm or less in the sinterable particles was 90% by mass.

Comparative Example 1

A sinter-bonding sheet of Comparative Example 1 was fabricated as in the sinter-bonding sheet of Example 1, except for altering the amount of the first silver particles (average particle diameter: 60 nm, particle size distribution: 5 to 100 nm, manufactured by DOWA Electronics Materials Co., Ltd.) blended from 53.78 parts by mass to 35.86 parts by mass, and altering the amount blended of the second silver particles (average particle diameter: 1,100 nm, particle size distribution: 400 to 5,000 nm, manufactured by Mitsui Mining & Smelting Co., Ltd.) from 5.976 parts by mass to 23.9 parts by mass. The content proportion of the sinterable particles in the sinter-bonding sheet of Comparative Example 1 was 93.2% by mass, and the proportion of the particles having a particle diameter of 100 nm or less in the sinterable particles was 60% by mass.

Comparative Example 2

34.05 parts by mass of the first silver particles (average particle diameter: 60 nm, particle size distribution: 5 to 100 nm, manufactured by DOWA Electronics Materials Co., Ltd.) as a sinterable particle, 34.05 parts by mass of the third silver particles (average particle diameter: 300 nm, particle size distribution: 145 to 1,700 nm, manufactured by DOWA Electronics Materials Co., Ltd.) as a sinterable particle, 0.75 parts by mass of a polycarbonate resin (trade name: "QPAC40", weight-average molecular weight: 150,000, solid at normal temperature, manufactured by Empower Materials Co., Ltd.) as a thermally decomposable polymeric binder, 3.02 parts by mass of isobornylcyclohexanol (trade name: "Tersolve MTPH", liquid at normal temperature, manufactured by Nippon Terpene Chemicals, Inc.) as a low-boiling point binder, and 28.13 parts by mass of methyl ethyl ketone as a solvent were mixed by a hybrid mixer (trade name: "HM-500", manufactured by Keyence Corp.) in its stirring mode to thereby prepare a vanish. The stirring time was set at 3 min. Then, the obtained vanish was applied and thereafter dried on a release-treated film (trade name: "MRA50", manufactured by Mitsubishi Plastics, Inc.) to thereby form an adhesive layer of 40 μm in thickness for sinter-bonding, that is, a sheet body of 40 μm in thickness of a sinter-bonding composition. The drying temperature was set at 110° C. and the drying time was set at 3 min. A sinter-bonding sheet of Comparative Example 2 having the adhesive layer containing the sinterable particles, the thermally decomposable polymeric binder and the low-boiling point binder was thus fabricated. The content proportion of the sinterable particles in the sinter-bonding sheet of Comparative Example 2 was 95% by mass, and the proportion of the particles having a particle diameter of 100 nm or less in the sinterable particles was 50% by mass.

(Fabrication of Samples)

By carrying out sinter-bonding by using each sinter-bonding sheet of Examples 1 to 6 and Comparative Examples 1 and 2, necessary numbers of samples to be used for each evaluation described later were fabricated for each sinter-bonding sheet.

In the fabrication of the samples each, first, a silicon chip (5-mm square, 350-μm thickness) having a planar electrode (5-mm square) on one face thereof was provided. The planar electrode has a lamination structure of a Ti layer (thickness: 50 nm) and a Au layer (thickness: 100 nm) on the silicon chip surface. Then, the sinter-bonding sheet was laminated onto the planar electrode of the silicon chip by using a laminater having a pressure-bonding roll. The lamination temperature was 70° C.; the lamination load (pressure by the pressure-bonding roll) was 0.3 MPa; and the speed of the pressure-bonding roll was 10 mm/s. A 5 mm-square silicon chip having the sinter-bonding sheet or an adhesive layer on one surface was thus obtained.

Then, the silicon chip having the sinter-bonding sheet obtained was sinter-bonded to a copper plate (thickness: 3 mm) wholly covered with a Ag film (thickness: 5 μm). Specifically, a sintering step was carried out by using a sintering apparatus (trade name: "HTM-3000", manufactured by Hakuto Co., Ltd.), in the laminated form in which the sinter-bonding sheet intervened between the copper plate and the silicon chip. In the present step, the pressurizing force loaded in the thickness direction on objects to be sinter-bonded was 10 MPa; the heating temperature for the sintering was 300° C.; and the heating time was 2.5 min.

Necessary numbers of the samples were thus fabricated for each sinter-bonding sheet of Examples 1 to 6 and Comparative Examples 1 and 2, as described above.

(Porosity Before the Sintering)

For each sinter-bonding sheet of Examples 1 to 6 and Comparative Examples 1 and 2, the porosity was examined as follows. Specifically, first, a cross-section of the sinter-bonding sheet was exposed by mechanically grinding the sinter-bonding sheet in a cooled environment. Then, the exposed cross-section was ion polished by using an ion polishing apparatus (trade name: "Cross Section Polisher SM-09010", manufactured by JEOL Ltd.). Then, a SEM image (image by a scanning electron microscope) in the sintered layer region in the exposed cross-section was taken by using a field emission scanning electron microscope SU8020 (manufactured by Hitachi High-Technologies Corp.) to acquire a reflection electron image as image data. The imaging condition was set at an acceleration voltage of 5 kV and a magnification of 2,000 times. Then, the acquired image data was subjected to an automatic binarization process involving binarization into solid portions and void portions or pore portions by using image analysis software, Image J. Then, the total area of the void portions and the area of the whole (the solid portions+the void portions) were determined from the image after binarization, and the porosity (%) was calculated by dividing the total area of the void portions by the whole area. Results thereof are shown in Table 1.

(Porosity after the Sintering)

For each sinter-bonding sheet of Examples 1 to 6 and Comparative Examples 1 and 2, the porosity of the sintered layer in the sinter-bonded sample was examined as follows. Specifically, first, a cross-section along the silicon chip diagonal line of the sinter-bonded sample was exposed by mechanical grinding. Then, the exposed cross-section was ion polished by using an ion polishing apparatus (trade name: "Cross Section Polisher SM-09010", manufactured by JEOL Ltd.). Then, a SEM image (image by a scanning electron microscope) in the sintered layer region in the exposed cross-section was taken by using a field emission scanning electron microscope SU8020 (manufactured by Hitachi High-Technologies Corp.) to acquire a reflection electron image as image data). The imaging condition was set at an acceleration voltage of 5 kV and a magnification of 2,000 times. Then, the acquired image data was subjected to an automatic binarization process involving binarization into metal portions and void portions or pore portions by using image analyzing software, Image J. Then, the total area of the void portions and the area of the whole (the metal portions+the void portions) were determined from the image after binarization, and the porosity (%) was calculated by dividing the total area of the void portions by the whole area. Results thereof are shown in Table 1.

(Bonding Reliability)

For each sinter-bonding sheet of Examples 1 to 6 and Comparative Examples 1 and 2, the bonding reliability of the sintered layer in each sinter-bonded sample was examined as follows. Specifically, first, the sample was subjected to 50 cycles of thermal shock in the temperature range of −40° C. to 200° C. by using a thermal shock tester (trade name: "TSE-103ES", manufactured by Espec Corp.). The temperature in one cycle involved a holding period at −40° C. for 15 min and a holding period at 200° C. for 15 min. Then, the bonding state by the sintered layer between the copper plate and the silicon chip in the sinter-bonded sample was imaged for confirmation thereof by using an ultrasonic imaging device (trade name: "FineSAT II", manufactured by Hitachi Construction Machinery Fine Tech Co., Ltd.). In this image picking-up, a transducer RQ-50-13:WD[frequency of 50 MHz] as a probe was used. In the acquired image, regions where the bonding state was retained were indicated by a grey color; and regions where exfoliation occurred were indicated by a white color, and the proportion of the total area of bonding regions to the whole area was calculated as a bonding ratio (%). Results thereof are shown in Table 1.

[Evaluation]

In the case of the sinter-bonding sheets (sinter-bonding composition) of Examples 1 to 6, than in the case of the sinter-bonding sheets of Comparative Examples 1 and 2, the sintered layer having a higher density could be formed between objects to be bonded, and the sinter-bonding exhibiting a higher bonding reliability could be materialized. With regard to the content proportion of the sinterable particles, the sinter-bonding sheets of Examples 1 to 6 were nearly equal to the sinter-bonding sheets of Comparative Examples 1 and 2. Further the sintered layers of the sinter-bonded samples according to the sinter-bonding sheets of Examples 1 to 6 and the sintered layers of the sinter-bonded samples of the sinter-bonding sheets of Comparative Examples 1 and 2 underwent a pressure of 10 MPa and were formed through the same sintering conditions involving the low loading. In spite thereof, a sintered layer having a significantly lower porosity and higher density in the case of the sinter-bonding sheets of Examples 1 to 6 than in the case of the sinter-bonding sheets of Comparative Examples 1 and 2 could be formed, and the sinter-bonding exhibiting a significantly higher bonding ratio after the thermal shock test could be materialized.

TABLE 1

|  |  | Example 1 | Example 2 | Example 3 | Example 4 | Example 5 | Example 6 | Comparative Example 1 | Comparative Example 2 |
|---|---|---|---|---|---|---|---|---|---|
| Sinterable Particle | First Silver Particle (average particle diameter: 60 nm) | 53.78 | 61.29 | 61.29 | 68.1 | — | 35.86 | 35.86 | 34.05 |
|  | Second Silver Particle (average particle diameter: 1,100 nm) | 5.976 | 6.81 | — | — | — | 5.976 | 23.9 | — |
|  | Third Silver Particle (average particle diameter: 300 nm) | — | — | 6.81 | — | — | — | — | 34.05 |
|  | Fourth Silver Particle (average particle diameter: 20 nm) | — | — | — | — | 61.29 | 17.93 | — | — |
|  | Fifth Silver Particle (average particle diameter: 500 nm) | — | — | — | — | 6.81 | — | — | — |
|  | Proportion of Particles of 100 nm or less in Particle Diameter (% by mass) | 90 | 90 | 90 | 100 | 90 | 90 | 60 | 50 |
| Thermally Decomposable Polymeric Binder | Polycarbonate resin | 0.87 | 0.75 | 0.75 | 0.75 | 0.75 | 0.87 | 0.75 | 0.75 |
| Low-Boiling Point Binder | Isobomylcyclohexanol | 3.47 | 3.02 | 3.02 | 3.02 | 3.02 | 3.47 | 3.47 | 3.02 |
| Content Proportion of Sinterable Particle (% by mass) |  | 93.2 | 95 | 95 | 95 | 95 | 93.2 | 93.2 | 95 |
| Pressurizing Force in Sintering (MPa) |  | 10 | 10 | 10 | 10 | 10 | 10 | 10 | 10 |
| Porosity before Sintering (%) |  | 6.5 | 6.3 | 2.2 | 1.8 | 6.9 | 9.4 | 18.4 | 12.2 |
| Porosity after Sintering (%) |  | 2.7 | 3.5 | 5.2 | 2.3 | 7.5 | 9.1 | 15.1 | 13.5 |
| Bonding Ratio after Thermal Shock Test (%) |  | 93.9 | 93.5 | 91.2 | 95 | 86.2 | 81.7 | 46.6 | 66.2 |

As the summary for the above, hereinafter, the constitutions and variations of the present invention will be listed as supplementary notes.

[Note 1]

A sinter-bonding composition comprising sinterable particles containing an electroconductive metal, wherein the particles have an average particle diameter of 2 μm or less, and a proportion of the particles having a particle diameter of 100 nm or less of not less than 80% by mass.

[Note 2]

The sinter-bonding composition according to Note 1, wherein the average particle diameter of the sinterable particles is 1.5 μm or less, 1.2 μm or less, 1 μm or less, 700 μm or less or 500 nm or less.

[Note 3]

The sinter-bonding composition according to Note 1 or Note 2, wherein the average particle diameter of the sinterable particles is 70 nm or more or 100 nm or more.

[Note 4]

The sinter-bonding composition according to any one of Note 1 to Note 3, wherein the proportion of the particles having a particle diameter of 100 nm or less in the sinterable particles is 85% by mass or more or 90% by mass or more.

[Note 5]

The sinter-bonding composition according to any one of Note 1 to Note 4, wherein the content proportion of the sinterable particles is 90 to 98% by mass, 92 to 98% by mass or 94 to 98% by mass.

[Note 6]

The sinter-bonding composition according to any one of [Note 1] to [Note 5], wherein the porosity is 10% or less, 8% or less, 6% or less, or 4% or less.

[Note 7]

The sinter-bonding composition according to any one of Note 1 to Note 6, wherein the porosity after sintering under conditions of 300° C., 10 MPa and 2.5 min is 10% or less, 8% or less, 6% or less or 4% or less.

[Note 8]

The sinter-bonding composition according to any one of Note 1 to Note 7, further comprising a thermally decomposable polymeric binder.

[Note 9]

The sinter-bonding composition according to Note 8, wherein the weight-average molecular weight of the thermally decomposable polymeric binder is 10,000 or more.

[Note 10]

The sinter-bonding composition according to Note 8 or Note 9, wherein the thermally decomposable polymeric binder is a polycarbonate resin and/or an acrylic resin.

[Note 11]

The sinter-bonding composition according to any one of Note 1 to Note 10, wherein the sinterable particles comprise at least one selected from the group consisting of silver, copper, silver oxide and copper oxide.

[Note 12]

The sinter-bonding composition according to any one of Note 1 to Note 11, wherein the viscosity at 70° C. is $5 \times 10^3$ to $1 \times 10^7$ Pa·s or $1 \times 10^4$ to $1 \times 10^6$ Pa·s.

[Note 13]

A sinter-bonding sheet, comprising an adhesive layer made from a sinter-bonding composition according to any one of Note 1 to Note 12.

[Note 14]

The sinter-bonding sheet according to Note 13, wherein the thickness at 23° C. of the adhesive layer is 5 μm or more or 10 μm or more.

[Note 15]

The sinter-bonding sheet according to Note 13 or Note 14, wherein the thickness at 23° C. of the adhesive layer is 100 μm or less or 80 μm or less.

[Note 16]

A dicing tape with a sinter-bonding sheet, comprising:

a dicing tape having a lamination structure comprising a base material and an adhesive layer; and a sinter-bonding sheet according to any one of Note 13 to Note 15 on the adhesive layer in the dicing tape.

REFERENCE SIGNS LIST

10 SINTER-BONDING SHEET
11 ADHESIVE LAYER
12 SINTERED LAYER
C SEMICONDUCTOR CHIP
X DICING TAPE WITH SINTER-BONDING SHEET
20 DICING TAPE
21 BASE MATERIAL
22 ADHESIVE LAYER
30 SEMICONDUCTOR WAFER

The invention claimed is:

1. A sinter-bonding composition, comprising:
   sinterable particles containing an electroconductive metal,
   wherein:
   the particles have an average particle diameter of 2 µm or less,
   a proportion of the particles having a particle diameter of 100 nm or less in the sinterable particles is not less than 80% by mass, and
   a porosity of the sinter-bonding composition before sintering thereof is 10% or less.

2. The sinter-bonding composition according to claim 1, wherein a content proportion of the sinterable particles is 90 to 98% by mass.

3. The sinter-bonding composition according to claim 1, further comprising a thermally decomposable polymeric binder.

4. The sinter-bonding composition according to claim 3, wherein a weight-average molecular weight of the thermally decomposable polymeric binder is 10,000 or more.

5. The sinter-bonding composition according to claim 3, wherein the thermally decomposable polymeric binder is a polycarbonate resin and/or an acrylic resin.

6. The sinter-bonding composition according to claim 1, wherein the sinterable particles comprise at least one selected from the group consisting of silver, copper, silver oxide and copper oxide.

7. A sinter-bonding sheet, comprising:
   an adhesive layer made from a sinter-bonding composition according to claim 1.

8. A dicing tape with a sinter-bonding sheet, comprising:
   a dicing tape having a lamination structure comprising a base material and an adhesive layer; and
   a sinter-bonding sheet according to claim 7 on the adhesive layer in the dicing tape.

* * * * *